United States Patent
Sengupta

(10) Patent No.: US 6,258,754 B1
(45) Date of Patent: Jul. 10, 2001

(54) LARGE, STRONGLY LINKED SUPERCONDUCTING MONOLITHS AND PROCESS FOR MAKING THE SAME

(75) Inventor: Suvankar Sengupta, Upper Arlington, OH (US)

(73) Assignee: Superconductive Components, Inc., Columbus, OH (US)

( * ) Notice: Subject to any disclaimer, the term of this patent is extended or adjusted under 35 U.S.C. 154(b) by 0 days.

(21) Appl. No.: 09/116,837

(22) Filed: Jul. 16, 1998

(51) Int. Cl.[7] .............................. B05D 5/12; H01L 39/24
(52) U.S. Cl. ..................... 505/450; 505/490; 505/491; 427/62
(58) Field of Search .................. 505/450, 490, 505/491, 733; 427/62

(56) References Cited

FOREIGN PATENT DOCUMENTS

| 1-157468 | * | 6/1989 | (JP) . |
| 1-157469 | * | 6/1989 | (JP) . |
| 1-160877 | * | 6/1989 | (JP) . |

* cited by examiner

Primary Examiner—Brian K. Talbot
(74) Attorney, Agent, or Firm—Hudak & Shunk Co., L.P.A.; Laura F. Shunk

(57) ABSTRACT

A process which relies on a joining technique between two individual strongly linked superconductors is disclosed. Specifically, this invention relates to fabrication of single domains of $YBa_2Cu_3O_x$ or $YBa_2Cu_3O_x$ with the addition of $Y_2BaCuO_5$ and/or other secondary phases such as $Pt/PtO_2$, $CeO_2$, $SnO_2$, Ag, $Y_2O_3$ and other rare earth oxides, by using a top-seeded, melt processing technique. Beginning with a single crystal seed such as $Nd_{1+x}Ba_{2-x}Cu_3O_3$ or $SmBa_2Cu_3O_x$ crystals, a melt-textured YBCO domain with crystallographic orientation nearly similar to that of the seed crystal can be fabricated. The samples are next machined to desired geometrical shapes. A bonding material is then applied to the ac plane. Low solidification or recrystalization point, similar crystal structure to that of $YBa_2Cu_3O_x$, and capability of growing epitaxially on YBCO domains are critical parameters of the bonding material. The pre-bonded samples are then heat treated such that the bonding material grows epitaxially on the ac plane of YBCO domains resulting in a strongly linked joint. A small amount of pressure may be used to keep neighboring domains together.

8 Claims, 3 Drawing Sheets

LARGE, STRONGLY LINKED SUPERCONDUCTING MONOLITHS AND PROCESS FOR MAKING THE SAME

FIELD OF THE INVENTION

This invention generally relates to the fabrication of a strongly linked array of high-temperature superconductors. Using this process, strongly linked superconductors with complex geometries and shapes can be fabricated.

SUMMARY OF THE INVENTION

This process relies on a joining technique between two individual strongly linked superconductors. Specifically, this invention relates to fabrication of single domains of $YBa_2Cu_3O_x$ or $YBa_2Cu_3O_x$ with the addition of $Y_2BaCuO_5$ and/or other secondary phases such as $Pt/PtO_2$, $CeO_2$, $SnO_2$, Ag, $Y_2O_3$ and other rare earth oxides, by using a top-seeded, melt processing technique. Beginning with a single crystal seed such as $Nd_{1+y}Ba_{2-x}Cu_3O_y$ or $SmBa_2Cu_3O_x$ crystals, a melt-textured YBCO domain with crystallographic orientation nearly similar to that of the seed crystal can be fabricated. The samples are next machined to desired geometrical shapes. A bonding material is then applied to the ac plane. Low solidification or recrystalization point, similar crystal structure to that of $YBa_2Cu_3O_x$, and capability of growing epitaxially on YBCO domains are critical parameters of the bonding material. The pre-bonded samples are then heat treated such that the bonding material grows epitaxially on the ac plane of YBCO domains resulting in a strongly linked joint. A small amount of pressure may be used to keep neighboring domains together.

This invention also relates to fabrication of a strongly linked array of YBCO for various applications including, for example, frictionless bearings, cylinders for shields and fault current limiters, and long-length superconductors for current leads and bus bars.

BACKGROUND OF THE INVENTION

One of the major problems inhibiting widespread application of high-temperature superconductors is their poor current-carrying capability (critical current density, "$J_c$"). In particular the $J_c$ is limited by the weak links at the grain boundaries and by poor flux pinning properties. Researchers have had some success in reducing the weak links by various texturing techniques. The most successful and popular techniques for overcoming the weak link problem have been the melt-texturing methods in the YBCO system and mechanical alignment or deformation induced texturing accompanied by partial melting in the BSCCO system.

Melt-processing techniques offer an attractive way to fabricate strongly linked YBCO. Moreover, defects such as fine $Y_2BaCuO_5$ inclusions and other structural defects (i.e., stacking faults and dislocations) can be incorporated during processing and can further enhance the current-carrying capability in these materials. In a typical melt-processing method, YBCO is heated above its peritectic point where it melts incongruently into $Y_2BaCuO_5$ and a Ba- and Cu-rich liquid. The semisolid melt is then cooled slowly (at around ~1° C./h about i.e. from 0.25° C./h to about 5° C./h) to obtain aligned grains of YBCO. The grains are aligned, however, only in small regions called domains. The superconductor is mostly strongly-linked within the domain by mostly strongly as used herein this might be from 70%–90%, preferably from 75% to 85% linked, wherein linking refers to conductive flow between domains at high magnetic fields.

The domains are separated by large-angle grain boundaries which generally act as weak links, thereby reducing the current-carrying capability in the presence of magnetic fields. The size of the strongly linked regions can be enhanced by increasing the domain size in the melt-processed YBCO. One way to increase the domain size is to use a directional solidification method with a controlled temperature gradient and by using a seed to initiate the grain growth. The use of a seed not only ensures a single nucleation site, but also permits controlled orientations of the grains.

Considerable progress in increasing the size of single-domain YBCO has been achieved through seeding methods which have the capability to control the crystal orientation of the "as-grown" single domains. Even with the advance in seeding methods, the diameter of the single domain is typically limited to roughly 50 mm. This size limitation is believed to be in part due to the high supercooling along the direction of growth which often leads to disorderly production of nuclei at the later stage of crystal growth resulting in multi-domained HTS (high-temperature superconductors). The limitation is also believed to be due to the lower temperature at the edges of the sample where grain nucleation can occur resulting in multiple impinging domains. Only under special conditions such as a composition gradient and/or a sizable temperature gradient can a large, single-domained YBCO be obtained. For example, using combined radial and vertical composition gradients, a 50-mm diameter sample with a trapped field of 1.27 T at 77 K has been reported. This impressive value, however, indicates that a $J_c$ of only $1\times10^4$ A/cm$^2$ is sustained by the sample. This $J_c$ value is considerably smaller than that of small-domain specimens ($3\times10^4$ A/cm$^2$ at 77 K and 1 T), and indicates that weak links are still present in the apparent single-domained HTS. The decreasing quality of large, single-domained HTS has been confirmed by X-ray rocking curve analyses where the c-axis spread in textured YBCO, near the seed, is found to be about 1.5° to 2° and increases to 3° to 15° near the edge of a 30-mm diameter sample. As a result of this deterioration in crystal perfection, the rate of increase in trapped field decreases drastically when the sample size exceeds roughly 30 mm. Consequently, there is a need for the development of a processing technique that can produce large single-domain HTS with high $J_c$ (i.e., of at least about 10,000 A/cm$^2$ at 77 K and without any weak links. Furthermore, fabrication of strongly linked complex shapes like rings and cylinders are difficult by seeding techniques.

This invention addresses a technique suitable for developing a strongly linked array of independent domains resulting in complex shapes desirable for various applications such as magnetic shields, fault current limiters, superconducting magnet bearings, current leads, and the like.

DESCRIPTION OF PREFERRED EMBODIMENT

Figure 1:
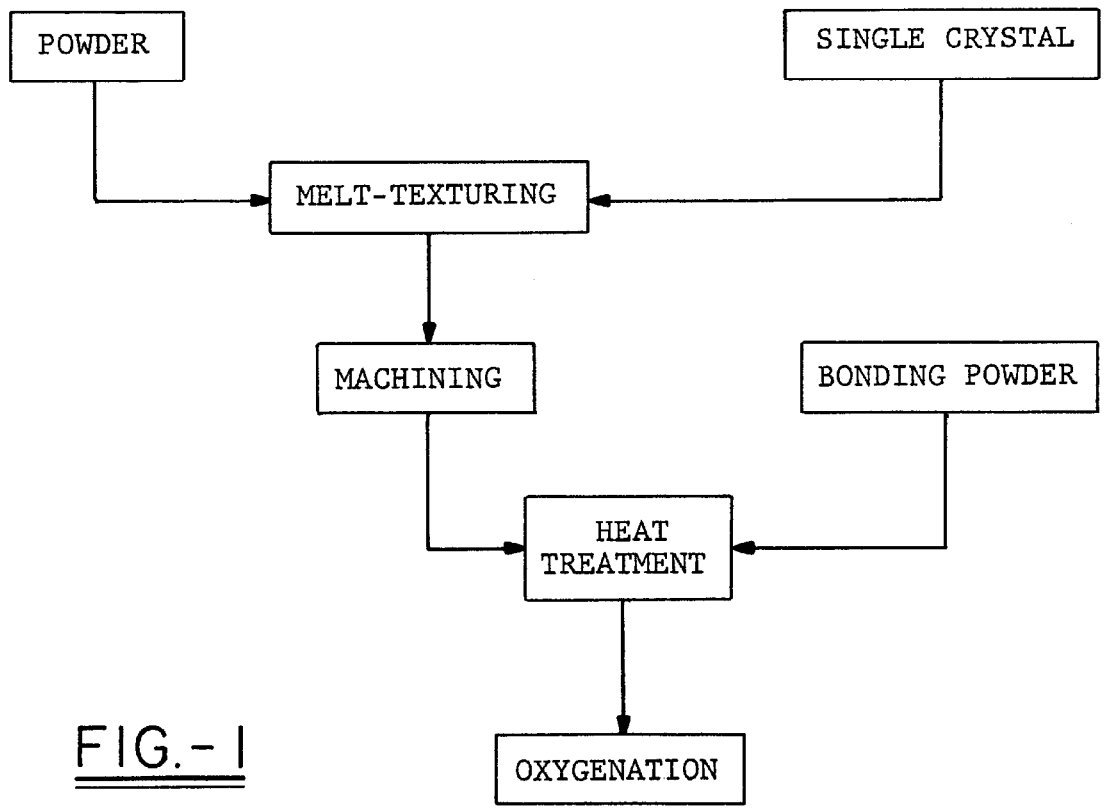
FIG. 1 is a flow chart for the process in accordance with the invention.

A strongly linked joint (such as for example, a joint with current-carrying capability above 10,000 A/cm$^2$ at 77° K can be developed by using YbBa$_2$Cu$_3$O$_x$ powders or YBa$_2$Cu$_3$O$_x$ precursor powders with additional secondary phases (Y$_2$O$_3$, BaCuO$_2$, and CuO) or (Y$_2$BaCuO$_5$, BaCuO$_2$, or CuO) with considerably lower melting or reaction temperatures in the boundary (applied to the ac plane) of two independent single domains previously grown by using a seeded melt-textured growth. The overall assembly is then heat-treated such that melting occurs only in the interface between the two domains. The assembly is then cooled slowly so that YbBa$_2$Cu$_3$O$_x$ or YBa$_2$Cu$_3$O$_x$ grows epitaxially on the interface. A small amount of pressure may preferably be applied to ensure desired bonding during heat treatment. The process of developing such a joint is shown schematically in FIG. 1.

The process of the present invention is applicable to produce various shapes such as bars, rings with rectangular or cubic cross-section, and cylinders for magnetic shields, fault current limiters, current leads, bus bars, superconductor-magnet frictionless bearings, and other applications.

Figure 2A:
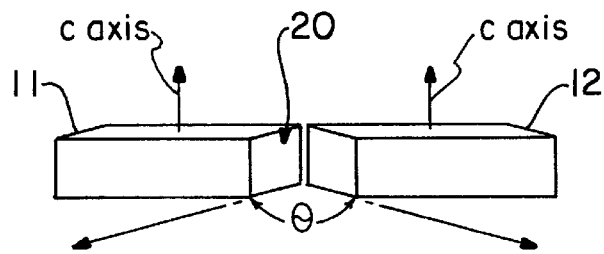
FIG. 2a and FIG. 2b show the critical angle between two independent domains. The angle should be less than 10° in order to achieve a strongly linked joint.
Figure 2B:
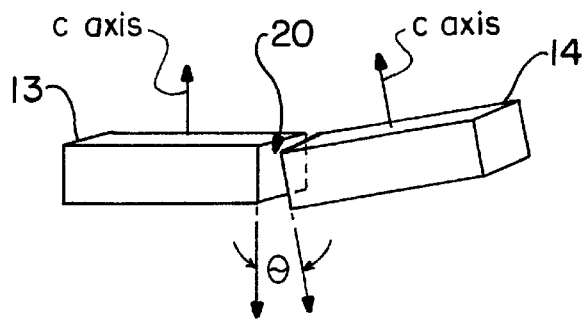
Figure 3A:
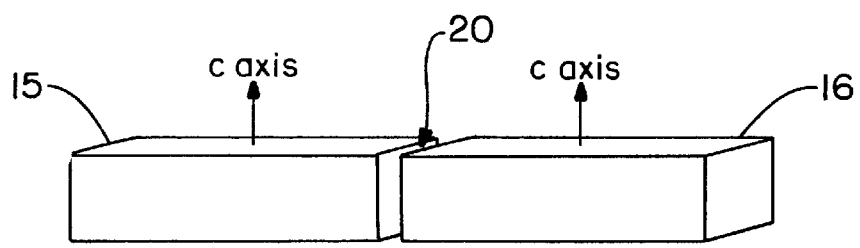
FIG. 3a and FIG. 3b are schematic diagrams showing the position domains and the bonding material in order to construct a bar.
Figure 3B:
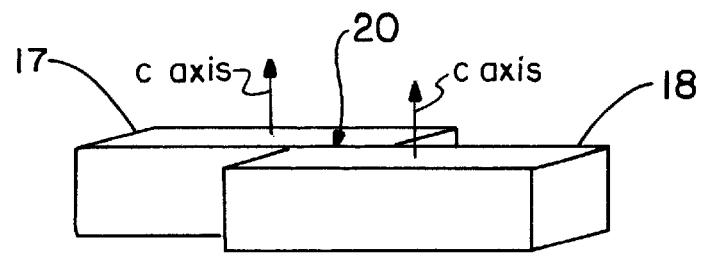

In order to develop strongly linked joints by using this process, it is essential that the angle between the ab planes of domain's 11 and 12 should be carefully controlled to below 10° as shown in FIGS. 2a and 2b. Furthermore, the bonding material (YbBa$_2$Cu$_3$O$_x$ or YBa$_2$Cu$_3$O$_x$) should grow epitaxially on the ac planes and maintain the similar lattice (i.e., the structural differences are minor and not of structural consequence). The desired microstructure can be achieved by proper positioning and suitable heat treatment. In particular the assembly should be heated to between about 960° C. to about 975° C. and cooled at a rate between about 0.5° C./h to about 5° C./h to between about 900° C. to about 890° C. when YbBa$_2$Cu$_3$O$_x$ is used as the bonding material. The assembly then should be cooled between about 10° C./h to about 100° C./h to avoid micro-cracks in the boundary or the interface that can limit the current-carrying capability. When the precursor Y$_2$O$_3$, BaCuO$_2$, and CuO) powder is used as the bonding material, the assembly should be heated to about 1000° C. and cooled slowly at a rate of between about 5° and 0.5° C./h to 920° C. to 900° C. The assembly should then be cooled between 10° C./h to 100° C./h to avoid micro-cracks in the boundary or the interface that can limit the current-carrying capability.

The technique can be utilized to fabricate various complex shapes with high current-carrying capability.

EXAMPLE 1

Bars

Strongly linked bars fabricated using this technique can be utilized for development of bus bars, current leads, and resistive fault current limiters. FIGS. 2a and 2b, and FIGS. 3a and 3b show the position of the bonding material 20 and independent domains 11, 12, 13, 14, 15, 16, 17 and 18.

EXAMPLE 2

Rings

Figure 4A:
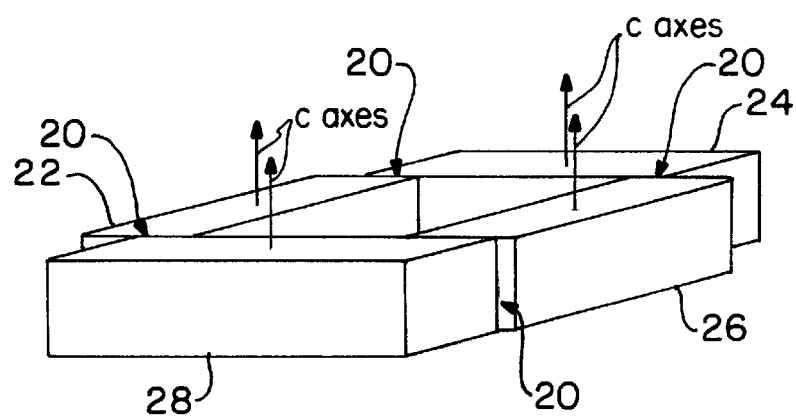
FIG. 4a and FIG. 4b are schematic diagrams, viewed from the side and top respectively, showing the position domains and the bonding material in order to construct a ring.
Figure 4B:
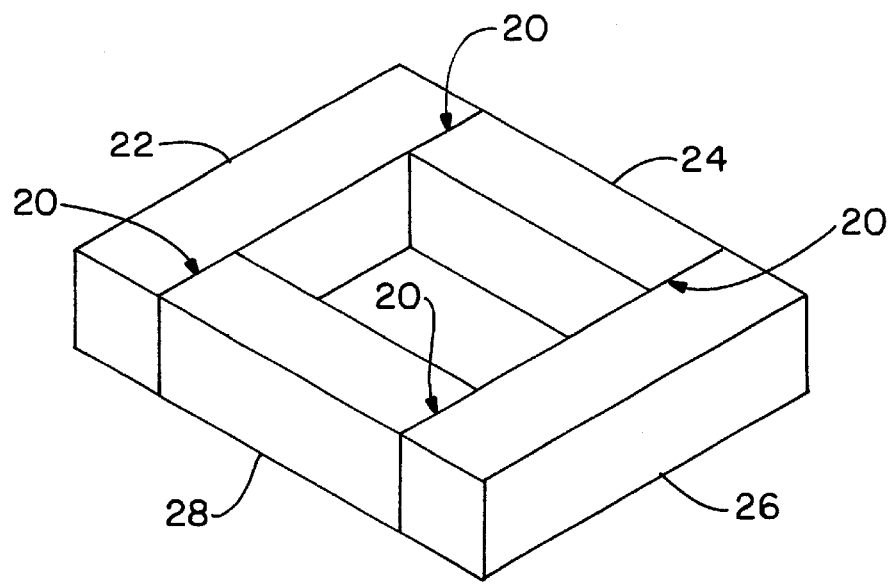

Strongly linked rings suitable for superconductor-magnet frictionless bearing can also be fabricated by using this process. Also the ring will be utilized as a building block for cylinders. The cross-section of the ring and the cylinder will, however, be rectangular or square instead of circular in order to keep the interface angle below 10°. The details of the bonding materials 20 and the position of the independent domains 22, 24, 26 and 28 are shown in FIG. 4.

EXAMPLE 3

Cylinders

Figure 5:
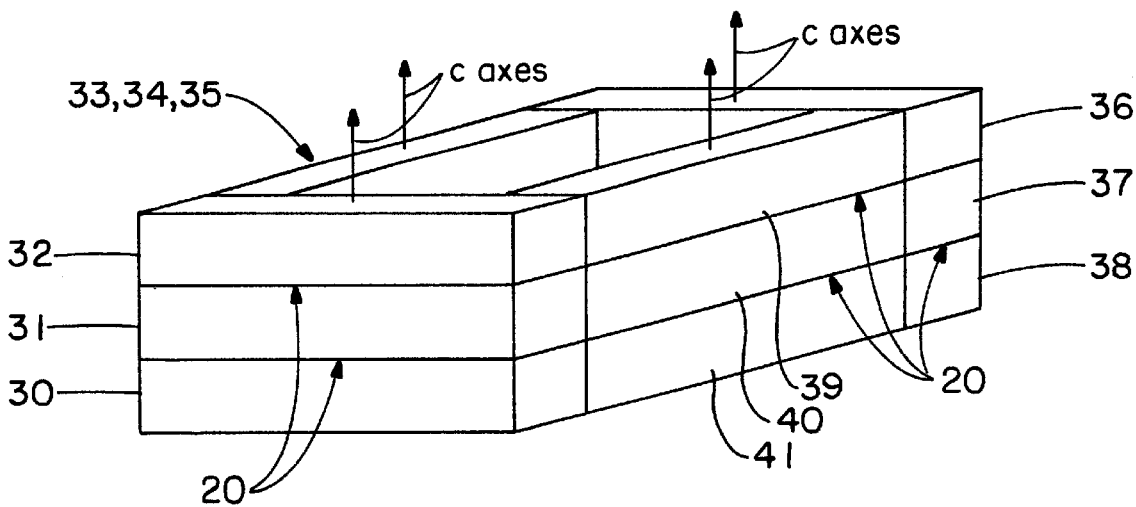
FIG. 5 is a schematic diagram showing the position domains and the bonding material in order to construct a cylinder with rectangular cross-section.

Strongly linked cylinders with rectangular or square cross-section can be utilized as magnetic shields and inductive fault current limiters. The cylinder is constructed by stacking rings as shown in FIG. 5. Since the shielding currents for magnetic shielding and fault current limiter applications flows at the circumference of the cylinder and does not flow perpendicular to the ab planes, it is not necessary to develop a strongly linked joint between independent rings. However, the bonding material 20 will be applied between independent domains 30–41 to achieve suitable mechanical strength that can withstand the stresses developed during handling.

CONCLUSIONS

Strongly linked YBCO superconductors can be obtained by using the process reported in this invention. Various shapes such as bars, rings, and cylinders suitable for current leads, fault current limiters, bus bars, magnetic shields, frictionless bearings, and other applications can be developed.

While in accordance with the patent statutes the best mode and preferred embodiment has been set forth, the scope of the invention not limited thereto, but rather by the scope of the attached claims.

What is claimed is:

1. A process for bonding at least two single domain structurally equivalent superconductors having a first melting point comprising:
   applying to the ac plane of said superconductors, bonding material having a second melting point lower than said first melting point and said bonding material being structurally equivalent to said superconductors to form an assembly,
   heating said assembly to a temperature below the first melting point but above the second melting point, and
   cooling said assembly at a rate of from about 0.5° C./hr to about 5° C./hr, with the optional application of pressure.

2. A process according to claim 1, wherein said bonding material is a ytterbium or yttrium-based powder.

3. A process according to claim 2, wherein said superconducting powder comprises YbBa$_2$Cu$_3$O$_x$ or (Y,Yb)Ba$_2$Cu$_3$O$_x$, YbBaCuO$_5$, or precursor powders thereof or combinations thereof.

4. A process according to claim 3, wherein said assembly is heated to between about 960° C. and about 975° C. and cooled at a rate about 0.5° C./hr to about 2° C./hr to a temperature of between about 900° C. and about 890° C., and then is cooled at a rate of from about 10° C./hr to about 100° C./hr to room temperature.

5. A process according to claim 1, including forming a strongly-linked continuous, integral, superconductor comprising said superconductors and said heat-treated bonding material having a diameter of at least about 50 mm.

6. A process according to claim 5, wherein said heat-treated bonding material between said superconductors is a single domain.

7. A process according to claim 1, wherein said superconductors have c axes which are aligned in one direction within at least about 10°.

8. A process according to claim 1, wherein said heat-treated bonding material has grains aligned in one direction.

* * * * *